(12) United States Patent
Farnworth

(10) Patent No.: US 7,295,462 B2
(45) Date of Patent: Nov. 13, 2007

(54) METHOD AND APPARATUS PROCESSING VARIABLE RESISTANCE MEMORY CELL WRITE OPERATION

(75) Inventor: Warren M. Farnworth, Nampa, ID (US)

(73) Assignee: Micron Technology, Inc., Boise, ID (US)

( * ) Notice: Subject to any disclaimer, the term of this patent is extended or adjusted under 35 U.S.C. 154(b) by 8 days.

(21) Appl. No.: 11/298,614

(22) Filed: Dec. 12, 2005

(65) Prior Publication Data

US 2007/0133255 A1    Jun. 14, 2007

(51) Int. Cl.
*G11C 11/00* (2006.01)
(52) U.S. Cl. .................. 365/158; 365/148; 365/149
(58) Field of Classification Search ................ 365/158, 365/149, 148, 174–175
See application file for complete search history.

(56) References Cited

U.S. PATENT DOCUMENTS

| | | | |
|---|---|---|---|
| 5,541,869 A | 7/1996 | Rose et al. | |
| 6,072,716 A | 6/2000 | Jacobson et al. | |
| 6,462,982 B1 * | 10/2002 | Numata et al. | 365/158 |
| 6,473,332 B1 | 10/2002 | Ignatiev et al. | |
| 2003/0045054 A1 | 3/2003 | Campbell et al. | |
| 2003/0047765 A1 | 3/2003 | Campbell | |

* cited by examiner

*Primary Examiner*—David Lam
(74) *Attorney, Agent, or Firm*—Dickstein Shapiro LLP (57) ABSTRACT

A circuit and method for writing to a variable resistance memory cell. The circuit includes a variable resistance memory cell, a switchable current blocking device and a charge storing element. As the switchable current blocking device blocks current flow through the variable resistance memory cell, the charge storing element charges. When the switchable current blocking device is not blocking current, the charge storing element discharges through the variable resistance memory cell, generating a write current sufficient to write high resistance variable resistance memory cells.

47 Claims, 8 Drawing Sheets

FIGURE 1

(PRIOR ART)

METHOD AND APPARATUS PROCESSING VARIABLE RESISTANCE MEMORY CELL WRITE OPERATION

FIELD OF THE INVENTION

The invention relates generally to the field of semiconductor devices and, more particularly, to variable resistance memory devices.

BACKGROUND OF THE INVENTION

Microprocessor-accessible memory devices have traditionally been classified as either non-volatile or volatile memory devices. Non-volatile memory devices are capable of retaining stored information even when power to the memory device is turned off. However, non-volatile memory devices occupy a large amount of space and consume large quantities of power, making these devices unsuitable for use in portable devices or as substitutes for frequently-accessed volatile memory devices. On the other hand, volatile memory devices tend to provide greater storage capability and programming options than non-volatile memory devices. Volatile memory devices also generally consume less power than non-volatile devices. However, volatile memory devices require a continuous power supply in order to retain stored memory content.

Commercially viable memory devices that are randomly accessed, have relatively low power consumption, and are semi-volatile or non-volatile are desired. Various implementations of such semi-volatile and nonvolatile random access memory devices are being developed. These devices store data in memory cells by structurally or chemically changing a physical property of the memory cells in response to applied programming voltages which in turn changes cell resistance. Examples of variable resistance memory devices being investigated include memories using variable resistance polymers, perovskite, doped amorphous silicon, phase-changing glasses, or doped chalcogenide glass, among others.

In a variable resistance memory cell, a first value may be written to the variable resistance memory cell by applying a current generated by a predetermined voltage level. The applied current changes the electrical resistance across the memory cell. A second value, or the default value, may be written or restored in the memory cell by applying a current due to a second voltage, thereby changing the resistance across the memory cell to the original resistance level. Each resistance state is stable, so that the memory cells are capable of retaining their stored values without being frequently refreshed. The variable resistance materials can thus be "programmed" to any of the stable resistance values.

Figure 1:
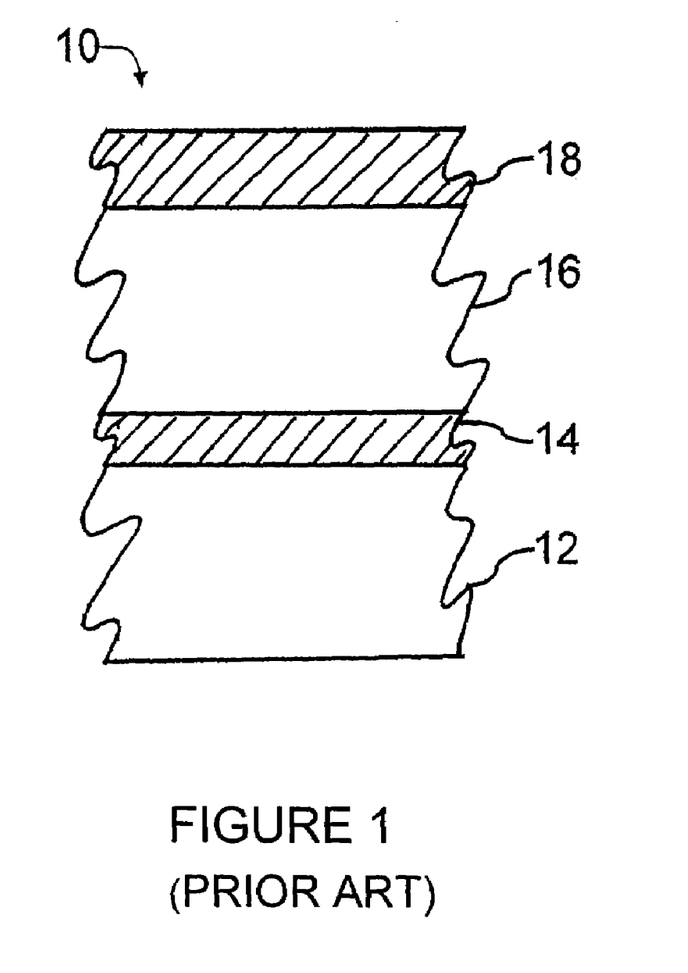
FIG. 1 depicts a basic composition of a variable resistance memory cell.

FIG. 1 shows a basic composition of a variable resistance memory cell 10 constructed over a substrate 12, having a variable resistance material 16 formed between two electrodes 14, 18. One type of variable resistance material may be amorphous silicon doped with V, Co, Ni, Pd, Fe and Mn as disclosed in U.S. Pat. No. 5,541,869 to Rose et al. Another type of variable resistance material may include perovskite materials such as $Pr_{(1-x)}Ca_xMnO_3$ (PCMO), $La_{(1-x)}Ca_xMnO_3$ (LCMO), $LaSrMnO_3$ (LSMO), $GdBaCo_xO_y$ (GBCO) as disclosed in U.S. Pat. No. 6,473,332 to Ignatiev et al. Still another type of variable resistance material may be a doped chalcogenide glass of the formula $A_xB_y$, where "B" is selected from among S, Se and Te and mixtures thereof, and where "A" includes at least one element from Group IIIA (B, Al, Ga, In, Tl), Group IVA (C, Si, Ge, Sn, Pb), Group VA (N, P, As, Sb, Bi), or Group VIIA (F, Cl, Br, I, At) of the periodic table, and with the dopant being selected from among the noble metals and transition metals, including Ag, Au, Pt, Cu, Cd, Ir, Ru, Co, Cr, Mn or Ni, as disclosed in U.S. Published Application Nos. 2003/0045054 and 2003/0047765 to Campbell et al. and Campbell, respectively. Yet another type of variable resistance material includes a carbon-polymer film comprising carbon black particulates or graphite, for example, mixed into a plastic polymer, such as that disclosed in U.S. Pat. No. 6,072,716 to Jacobson et al. The material used to form the electrodes 14, 18 can be selected from a variety of conductive materials, such as tungsten, nickel, tantalum, titanium, titanium nitride, aluminum, platinum, or silver, among others.

While the overall operating scheme of the memory cell 10 may be similar regardless of the type of variable resistance material 16 used, much research has focused on memory devices using memory elements having doped chalcogenide materials as the variable resistance material. More specifically, memory cells having a variable resistance material formed of germanium-selenide glass having a stoichiometry of $Ge_xSe_{(100-x)}$, with x ranging from about 20 to about 43, which are doped with metal ions, have been shown to be particularly promising for providing a viable commercial alternative to traditional non-volatile random-access memory devices.

Figure 2:
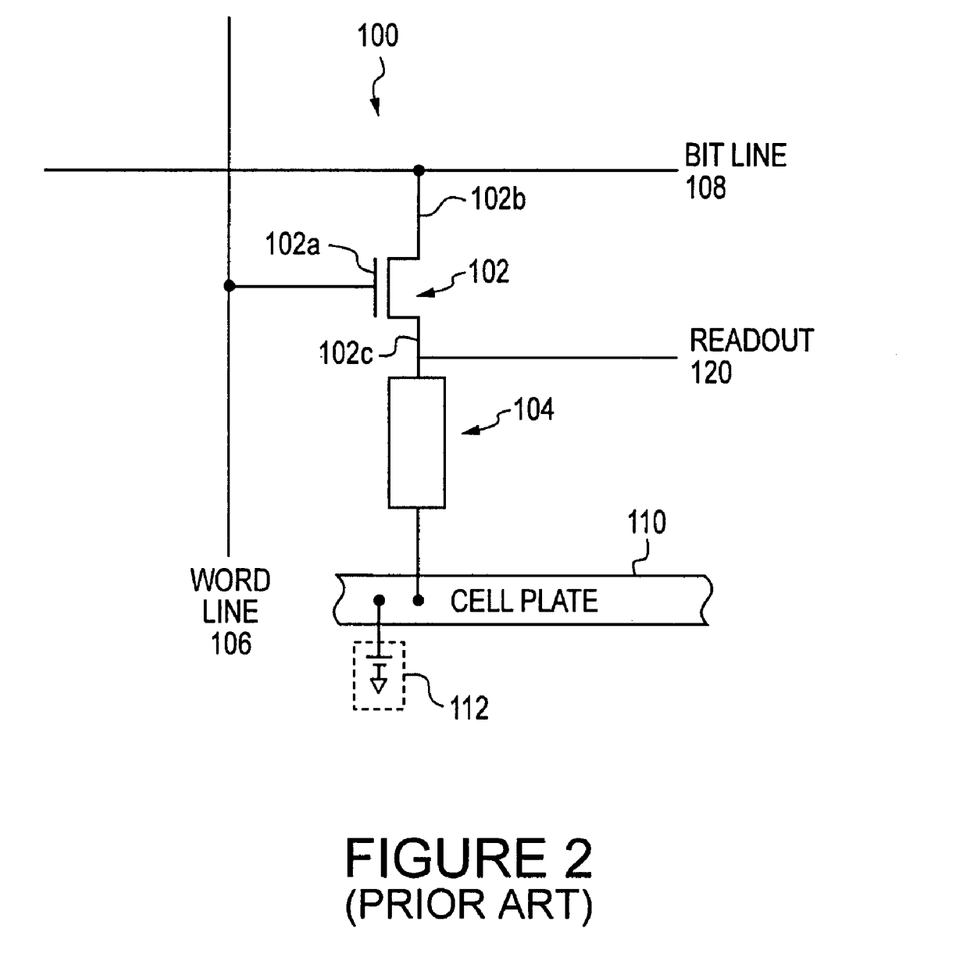
FIG. 2 is a typical prior art chalcogenide variable resistance memory cell.

In FIG. 2, a typical prior art ionic chalcogenide glass variable resistance memory cell 100 is shown and includes an access device 102, a chalcogenide variable resistance memory element 104, and a common cell plate 110. The access device 102 is a transistor having a gate 102a coupled to a word line 106 and one terminal (source) 102b coupled to a bit line 108. The other terminal (drain) 102c of the access device 102 is coupled to one end of the chalcogenide variable resistance memory element 104, while the other end of the chalcogenide variable resistance memory element 104 is coupled to the cell plate 110. The cell plate 110 may span and be coupled to several other chalcogenide variable resistance memory cells, and may form the anode of all the memory elements 104 in an array of chalcogenide variable resistance memory cells. The cell plate 110 is also coupled to a potential source 112.

Application of the write and erase voltages depends on the type of chalcogenide variable resistance memory cells. In ionic chalcogenide variable resistance memory cells, application of the write voltage may be achieved by raising the potential at the cell plate 110 (anode) relative to the access device drain 102b by applying or raising the voltage at the potential source 112, lowering the potential of the bit line 108, or a combination of both. To erase a programmed memory element 104, a negative voltage having a magnitude of at least a threshold erase voltage is applied between the anode and the cathode of the memory element 104, such that the potential at the cell plate 110 is lower than the potential of the bit line 108. In a read operation, the resistance of the memory element 104 is measured between the cell plate 110 and the readout line 120.

In phase change chalcogenide variable resistance memory cells, an erase voltage may be applied by creating a brief but sufficient voltage potential across memory element 104. The voltage potential may be in either direction and is caused by changing the potential at the potential source 112, the bit line 108, or a combination of both. The erase voltage is strong enough to generate a current through the memory element 104 that melts the phase change material in the memory element 104. When the erase voltage is abruptly turned off, the phase change material in memory element 104 cools into an amorphous, non-crystalline state with high resistance. A write current is applied by application of a lesser but more sustained write voltage across memory element 104. The applied write current need not be in a specific direction, but must be sufficient to "warm" the phase change material in the memory element 104 to allow rearrangement of the phase change material into a low-resistance crystalline state. As with the ionic chalcogenide variable resistance memory cells, the resistance of the memory element 104 is measured between the cell plate 110 and the readout line 120.

Figure 3:
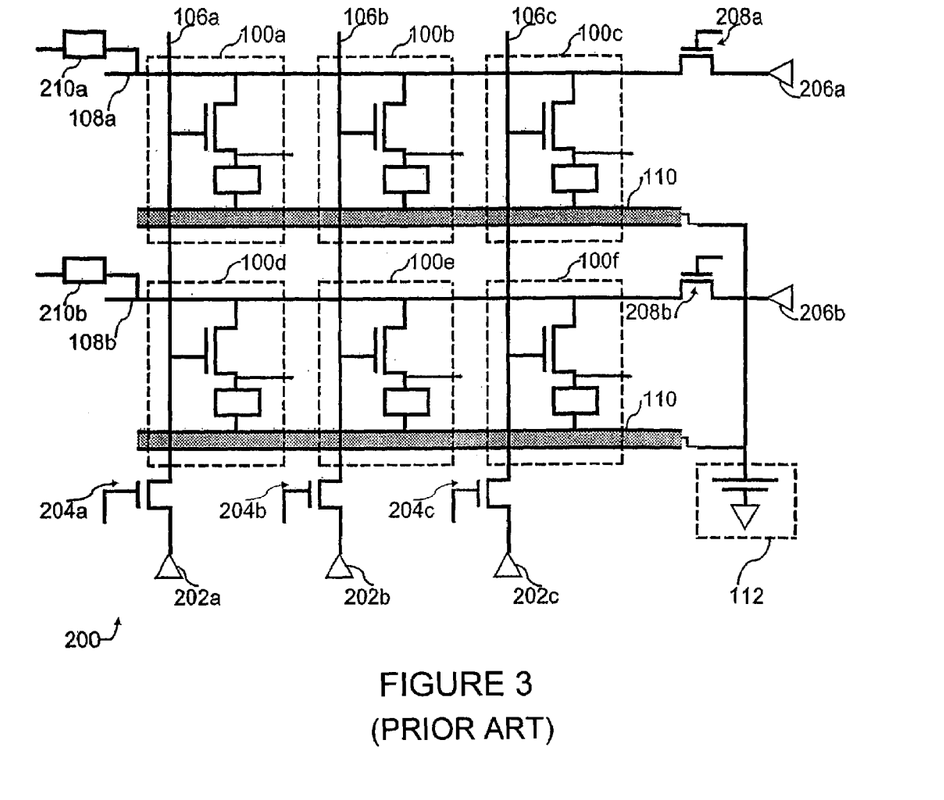
FIG. 3 is a prior art memory device comprising an array of memory cells arranged in rows and columns.

Chalcogenide variable resistance memory cells are arranged as an array of memory cells and are written, erased, and read using a controller. FIG. 3 illustrates a prior art memory device 200 comprising an array of memory cells 100a-100f arranged in rows and columns. The memory cells 100a-100f along any given bit line 108a, 108b do not share a common word line 106a-106c. Conversely, the memory cells 100a-100f along any given word line 106a-106c do not share a common bit line 108a-108b. In this manner, each memory cell is uniquely identified by the combined selection of the word line to which the gate of the memory cell access device is connected, and the bit line to which the source of the memory cell access device is connected.

Each word line 106a-106c is connected to a word line driver 202a-202c via a respective transistor 204a-204c for selecting the respective word line for an access operation. The gates of the transistors 204a-204c are used to selectively couple or decouple the word lines 106a-106c to or from the word line drivers 202a-202c. Similarly, each bit line 108a, 108b is coupled to a driver 206a, 206b via selector gates 208a, 208b. The current and/or resistance of a selected memory cell 100a-100f is measured by sense amplifiers 210a, 210b connected respectively to the bit lines 108a, 108b.

For simplicity, FIG. 3 illustrates a memory array having only two rows of memory cells 100 on two bit lines 108a-108b and three columns of memory cells 100 on three word lines 106a-106c. However, it should be understood that in practical applications, memory devices would have significantly more cells in an array. For example, an actual memory device may include several million memory cells 100 arranged in a number of subarrays.

Generally, a chalcogenide variable resistance memory cell has an initial "off" state resistance of over 100 kΩ (for example, 1 MΩ). To perform a write operation on a chalcogenide memory cell in its normal high resistive state, a sufficiently strong write current must be applied. Upon applying the threshold level or write voltage, the resistance across the memory cell changes to a level dramatically reduced from the resistance in its normal state. The new resistance of the memory cell is less than 100 kΩ (for example, 20 kΩ). The cell is considered to be in the "on" state while in the low-resistive state.

The chalcogenide variable resistance memory cell retains this new lower level of resistivity until the resistivity is changed by another qualifying voltage level applied to one of the electrodes of the cell. For example, in an ionic chalcogenide variable resistance memory cell, the memory cell is returned to the high resistance state by applying an erase voltage thereto in the negative direction of the voltage applied in the write operation (to achieve the lower resistance state), thus inducing an erase current to flow through the memory cell in a direction opposite that of the applied write current. The erase voltage may or may not be the same magnitude as the write voltage.

Over time, however, the resistance level resulting from application of various write and erase currents to a chalcogenide variable resistance memory cell tend to drift. Resistance drift occurs in various types of chalcogenide variable resistance memory cells, including both phase change and ionic chalcogenide variable resistance memory cells.

In a phase change chalcogenide variable resistance memory cell, write and erase currents are applied that actually melt or warm the chalcogenide variable resistance memory cell. The write and erase currents are generated by applying a specific voltage potential to the chalcogenide variable resistance memory cell. The generated current, then, is a function of both the applied voltage and the resistance of the chalcogenide variable resistance memory cell (I=V/R). However, over time and repeated phase changes, the volume of cell material that actually changes phase (and hence resistance) actually decreases. The result is an overall increase in the resistance of the chalcogenide variable resistance memory cell. Thus, for a given applied voltage potential, less current is generated. At some point, the current generated may be insufficient to adequately melt or warm the memory cell.

Figure 4:
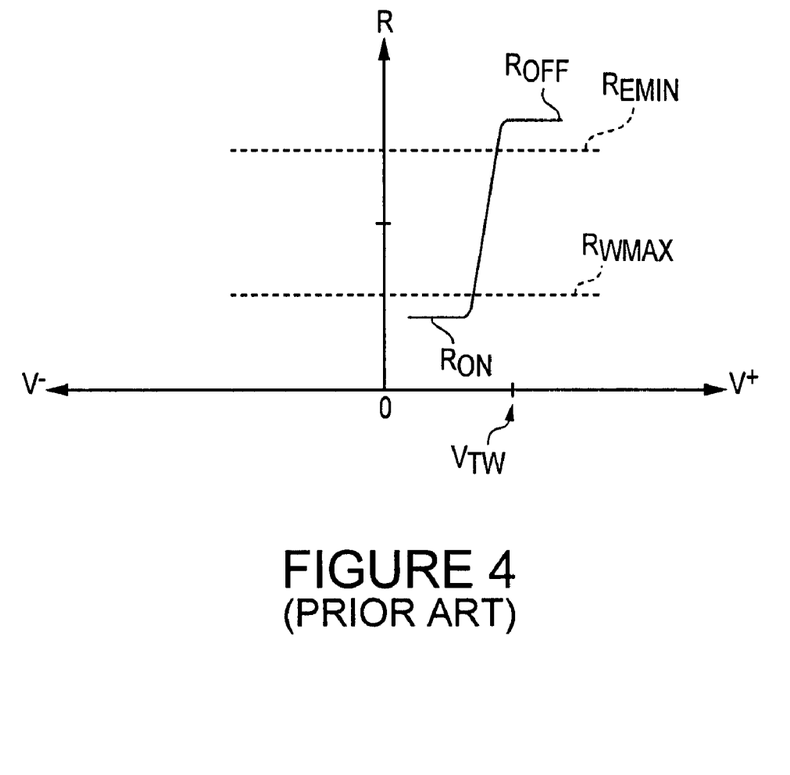
FIG. 4 depicts a standard voltage/resistance curve for a write operation performed on a properly functioning ionic chalcogenide variable resistance memory cell.

In the case of ionic chalcogenide variable resistance memory cells, resistance drift may be demonstrated using voltage/resistance curves for write and erase operations. A standard voltage/resistance curve for a write operation performed on a properly functioning ionic chalcogenide variable resistance memory cell is illustrated in FIG. 4. A voltage/resistance curve, such as that shown in FIG. 4, is derived by measuring the resistance across the ionic chalcogenide variable resistance memory cell as a function of voltage for a given current. The initial or normal resistance level of an ionic chalcogenide variable resistance memory cell is shown as $R_{OFF}$, which is above a minimum threshold level $R_{EMin}$ in which the ionic chalcogenide variable resistance memory cell is stable in a high resistance state. When the ionic chalcogenide variable resistance memory cell is in the high resistance state and $V_{TW}$ is applied to the cell, the resistance drops to the level indicated by $R_{ON}$, which is below a maximum threshold level $R_{WMax}$ in which the ionic chalcogenide variable resistance memory cell is stable in a low resistance state.

However, the phenomenon of resistance drift in ionic chalcogenide variable resistance memory cells may eventually result in a memory cell being erased into an "off" state in which the resistance is unacceptably high. This can happen in as few as about 400 write and erase cycles. Typical life expectancies for random access memory devices are on the order of $10^{14}$ write/erase cycles. Thus, the resistance drift must be compensated for in order to improve the longevity of operation of the memory cell.

Figure 5:
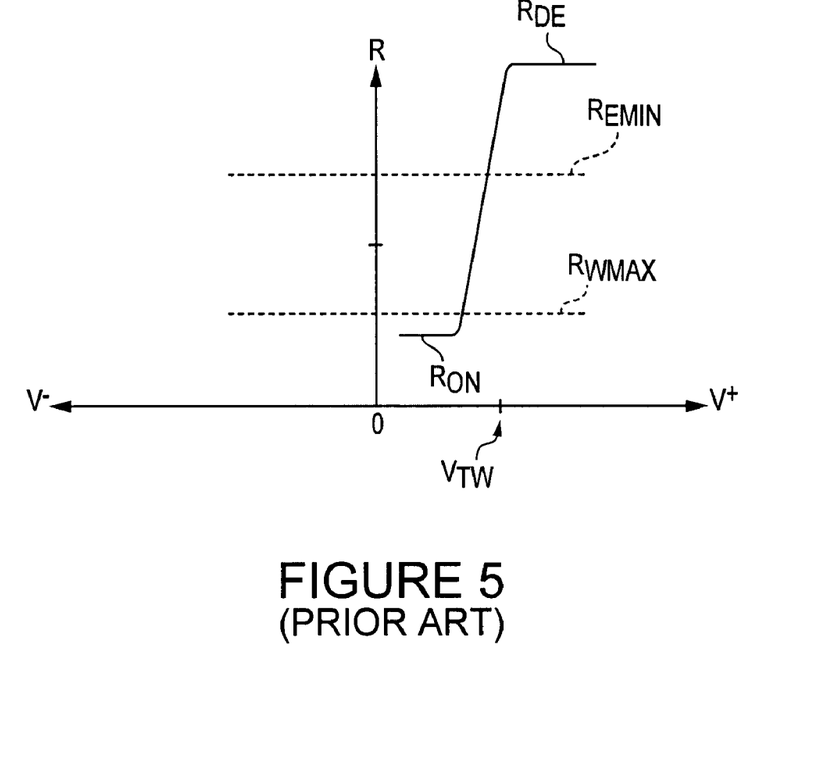
FIG. 5 depicts a voltage/resistance curve for an ionic chalcogenide variable resistance memory cell subject to resistance drift.

FIG. 5 depicts the case when the ionic chalcogenide variable resistance memory cell drifts towards a high resistance "off" state $R_{DE}$, meaning that after repeated cycles over time, the "off" state resistance achieved upon application of a fixed erase voltage settles above the level $R_{OFF}$ shown in FIG. 4. Note that as $R_{DE}$ increases, the threshold write voltage $V_{TW}$ also increases. If $V_{TW}$ becomes larger than the applied write voltage, application of the write voltage will be insufficient to bring the memory cell to the maximum stable low resistance level $R_{WMax}$. Once this condition is reached, subsequent write operations will fail to write the stored value in the ionic chalcogenide variable resistance memory cell, causing a breakdown in the function of the ionic chalcogenide variable resistance memory device. Additionally, continued erase cycles applied to these already high resistance state memory cells result in pushing the memory cells into an even higher resistance state.

One solution to the resistance drift problem described above in the context of both phase change and ionic chalcogenide variable resistance memory cells is to apply a higher write voltage, thereby inducing a stronger write current. A sufficiently strong write current could overcome the high resistance state, and successfully convert the chalcogenide variable resistance memory device into an "on" state. An alternative approach for the ionic chalcogenide variable resistance memory cell is to apply a sufficiently strong reset voltage to periodically correct the resistance drift and reset the on and off resistance levels. Unfortunately, the current drivers that are being used to provide the necessary higher write currents or reset currents are large; thus, unavoidably resulting in very large chalcogenide variable resistance memory devices and a low cell density.

There is, therefore, a desire and need to provide a controlled, high write current through a variable resistance memory device, for example, a chalcogenide variable resistance memory device in such a way as to overcome the increased resistance resulting from resistance creep, reduce the size of the variable resistance memory device and increase cell density.

BRIEF SUMMARY OF THE INVENTION

Exemplary embodiments of invention provide a circuit for writing to a variable resistance memory cell. The circuit includes a variable resistance memory cell, a switchable current blocking device and a charge storing element. The switchable current blocking device is configured to block current flow through the variable resistance memory cell when the switchable current blocking device is in an off state. While current is blocked, the charge storing element charges. When the switchable current blocking device is in an on state, the charge storing element discharges through the variable resistance memory cell and generates a write current sufficient to write high resistance variable resistance memory cells.

Exemplary embodiments of invention also provide a method for writing to a variable resistance memory cell. An initial write current to the variable resistance memory cell is blocked through the use of a switchable current blocking device. While the initial write current is blocked, a charge storing element is charged. At some point when the switchable current blocking device no longer blocks current, the charge storing element is discharged through the variable resistance memory cell, thus writing to the variable resistance memory cell.

These and other aspects of the invention will be more clearly recognized from the following detailed description of the invention which is provided in connection with the accompanying drawings.

DETAILED DESCRIPTION OF THE INVENTION

Figure 6:
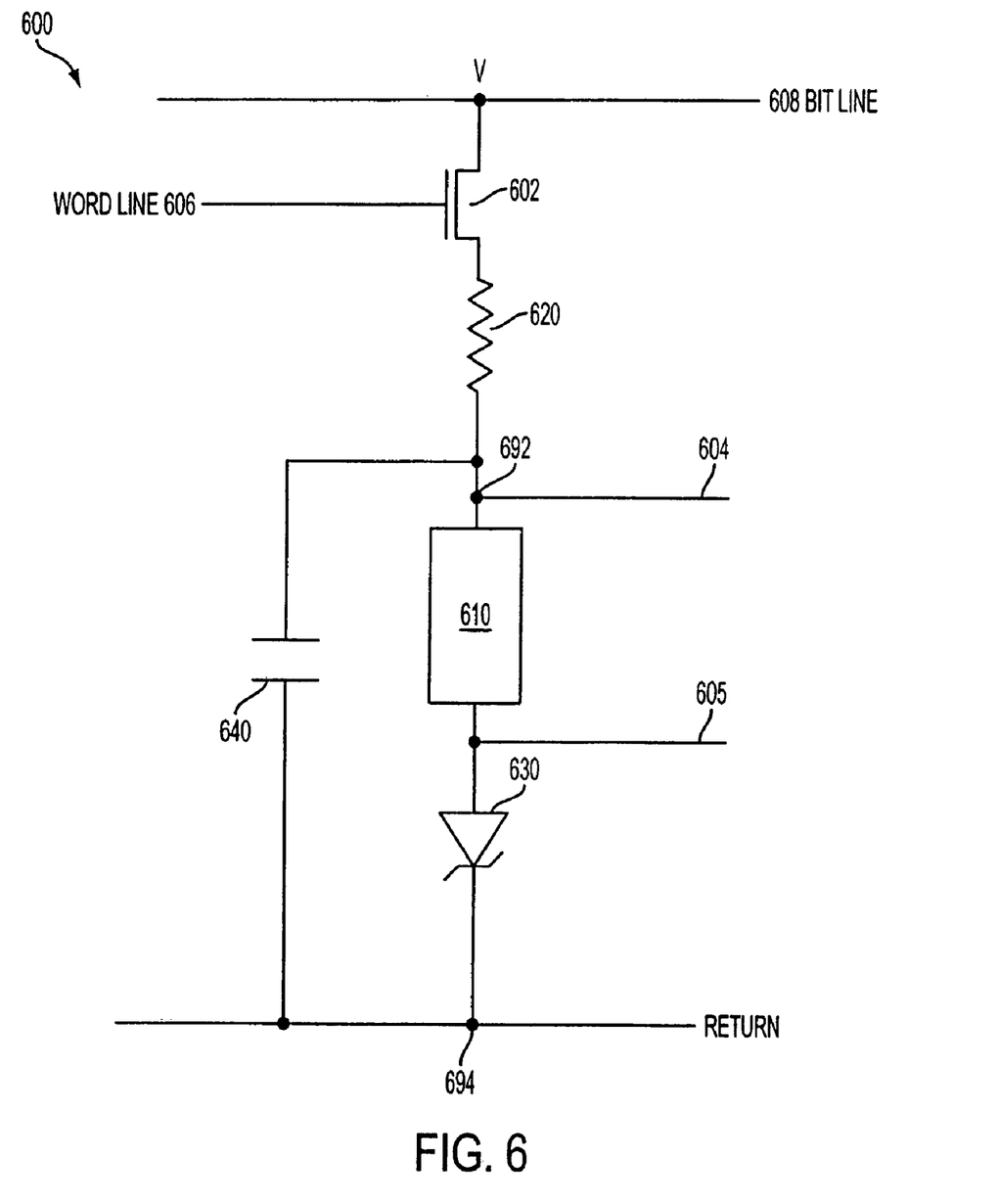
FIG. 6 is a circuit to induce a write current in a chalcogenide variable resistance memory cell according to an exemplary embodiment of the invention.

In an exemplary embodiment of the invention, a capacitive element and a current blocking device such as a Zener diode may be used to induce increased current flow through a chalcogenide variable resistant memory cell. FIG. 6 depicts a current-inducing circuit 600 in accordance with an exemplary embodiment of the invention. The circuit 600 includes a chalcogenide variable resistance memory cell 610, a load resistor 620, a voltage supply V and readout lines 604 and 605 (for reading the value of the chalcogenide variable resistance memory cell 610). The readout line 604 corresponds to the readout line 120 of FIG. 2, and a return line corresponds to the cell plate 110 of FIG. 2. Voltage supply V is provided via bit line 608. An access device 602 is located between the voltage source V and junction 692. An activating word line 606 is connected to the access device 602. A current blocking device, such as a Zener diode 630, is placed in series with the chalcogenide variable resistance memory cell 610, between the readout line junction 692 and the return junction 694. A capacitive element 640 is connected in parallel to the chalcogenide variable resistance memory cell 610 and the Zener diode 630.

The Zener diode 630 initially blocks passage of current through the chalcogenide variable resistance memory cell 610 when a write voltage V is applied to the circuit—presuming that the applied write voltage is less than the Zener breakdown voltage of Zener diode 630. Capacitive element 640 is charged during the time the Zener diode blocks the current. When the voltage potential across the capacitive element 640 exceeds the Zener breakdown voltage, the Zener diode 630 allows current to pass through the Zener diode 630 and the chalcogenide variable resistance memory cell 610. Due to the increased voltage potential caused by the charged capacitive element 640, the current flow through the chalcogenide variable resistance memory cell 610 is also increased. The Zener diode 630 is selected based on its having a Zener breakdown voltage that allows a sufficient voltage potential across capacitive element 640 and resulting current to write the chalcogenide variable resistance memory cell 610 despite a higher than normal "off" resistance. Alternatively, in the case of an ionic chalcogenide variable resistance memory cell, the Zener diode 630 may be selected based on its having a Zener breakdown voltage that results in a reset of the resistance states of the ionic chalcogenide variable resistance memory cell 610.

In the case of a phase change chalcogenide variable resistance memory cell, voltage source V is maintained at a constant value during the entire write cycle. Even after the initial discharge of capacitive element 640, voltage source V maintains current flow through the chalcogenide variable resistance memory cell 610 so as to allow a "slow" cool-down period for the chalcogenide variable resistance memory cell 610. A slow cool-down period (referring to the period of time immediately after the chalcogenide variable resistance memory cell 610 has undergone a physical change due to an applied current) is essential to allow the chalcogenide variable resistance memory cell 610 to organize a crystalline pattern that has a predictable resistance and is susceptible to future current-induced physical changes. If the voltage source V is turned-off prematurely, the chalcogenide variable resistance memory cell 610 will cool too quickly, resulting in an amorphous material state in place of a crystalline structure.

The embodiment of the invention described in FIG. 6 is successful in providing a high-current source that allows resistance variable memory devices such as chalcogenide variable resistant memory devices increased longevity and usefulness. The embodiment of the invention also removes the need for large current drivers. Much smaller current drivers are used to charge the capacitive element 640, and thus higher memory cell density may be achieved. Additionally, the embodiment of the invention utilizes less power than conventional chalcogenide variable resistance memory devices, as there is less high current trace loss due to lower currents flowing through the main circuit traces.

Figure 7:
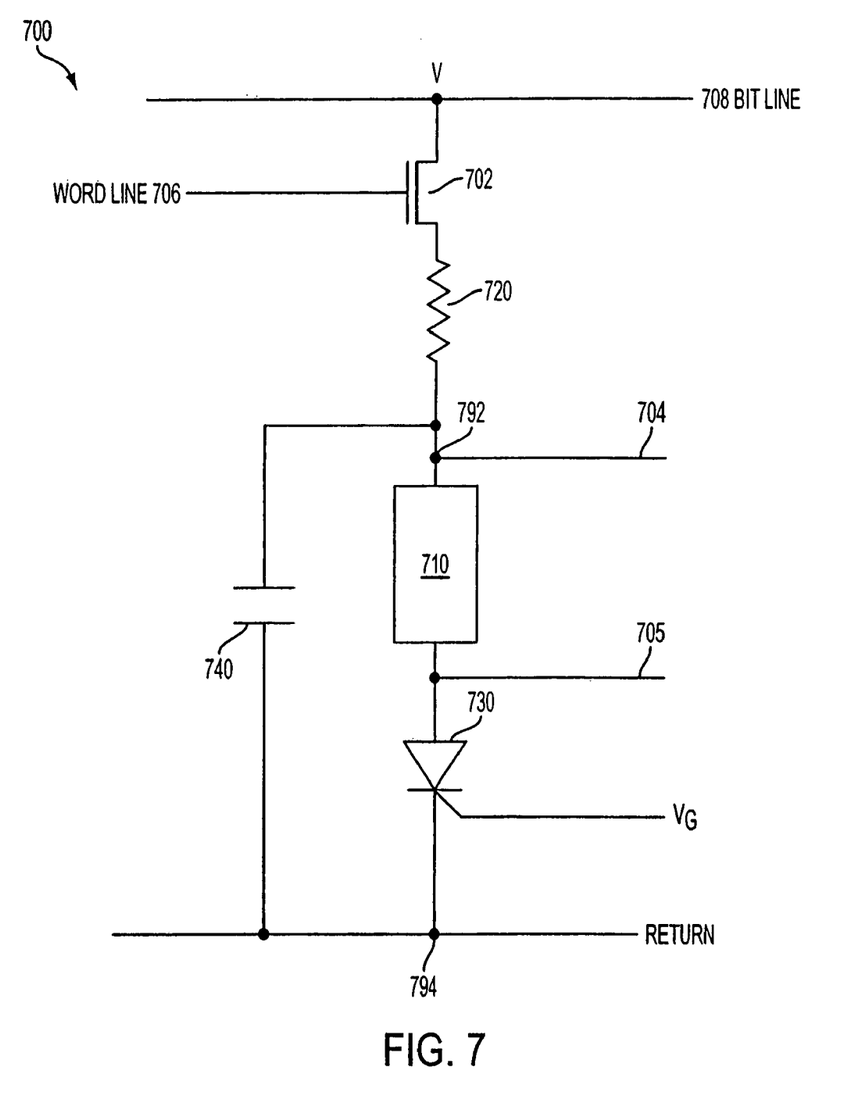
FIG. 7 is a circuit to induce a write current in a chalcogenide variable resistance memory cell according to another exemplary embodiment of the invention.

In a second embodiment of the invention, a silicon-controlled rectifier (SCR) is used as the current blocking device instead of a Zener diode. In FIG. 7, a current-inducing circuit 700 is shown and includes a chalcogenide variable resistance memory cell 710, a load resistor 720, capacitive element 740, a voltage supply V and readout lines 704 and 705 (for reading the value of the chalcogenide variable resistance memory cell 710). The readout line 704 corresponds to the readout line 120 of FIG. 2, and a return line corresponds to the cell plate 110 of FIG. 2. Voltage supply V is provided via bit line 708. An access device 702 is located between the voltage source V and junction 792. An activating word line 706 is connected to the access device 702. A silicon-controlled rectifier 730 is placed in series with the chalcogenide variable resistance memory cell 710, between the readout line junction 792 and the return junction 794. The silicon-controlled rectifier is gated by a gating voltage $V_G$.

Silicon-controlled rectifier 730 is generally non-conducting as long as gating voltage $V_G$ is lower than the silicon-controlled rectifier cathode voltage. Thus, when a write voltage V is applied to the circuit 700, and when the silicon-controlled rectifier 730 is turned "off" via, e.g., a high gating voltage $V_G$, the capacitive element 740 is charged. After capacitive element 740 is charged, silicon-controlled rectifier 730 is turned "on" via the assertion of, e.g., a low gating voltage $V_G$; capacitive element 740 discharges across the chalcogenide variable resistance memory cell 710, thus inducing a high-current writing of the chalcogenide variable resistance memory cell 710.

Although the second embodiment requires a greater degree of logic control, using a silicon-controlled rectifier 730 would guarantee that all chalcogenide variable resistance memory cells are written at a precise moment. Because of possible manufacturing variations in Zener diodes, the writing of multiple chalcogenide variable resistance memory cells is not guaranteed to occur at precisely the same time in the first embodiment.

In other embodiments of the invention, the capacitive element is replaced with any device that can store charge, including a circuit trace having a sufficiently large parasitic capacitance. Additionally, although specific configurations have been described, the invention is not limited to the described configurations. Other configurations of a charge-storing element, a variable resistance memory cell and a current blocking element could be designed that would result in similar results, i.e., the current blocking element preventing current from flowing through the variable resistance memory cell while inducing the charge-storing element to accumulate charge prior to the current blocking element's breakdown or switching and the discharging of charge from the charge-storing element through the variable resistance memory cell.

Although the embodiments of the invention have been described in relation to chalcogenide variable resistance memory cells, it is foreseeable that additional embodiments of the invention could include other variable resistance memory cells in which resistance drift is an issue.

It should be appreciated that the invention encompasses a method of fabricating the current inducing circuits of FIGS. 6 and 7 as part of an integrated circuit. Accordingly, the invention may comprise the integrated circuit fabrication acts of fabricating a current blocking element, a charge storing element and a variable resistance memory cell. The current blocking element is fabricated so as to simultaneously block current from flowing through the variable resistance memory cell while inducing the accumulation of charge in the charge storing element. The current blocking element is also fabricated to either breakdown or switch to allow the charge storing element to discharge through the variable resistance memory cell.

Figure 8:
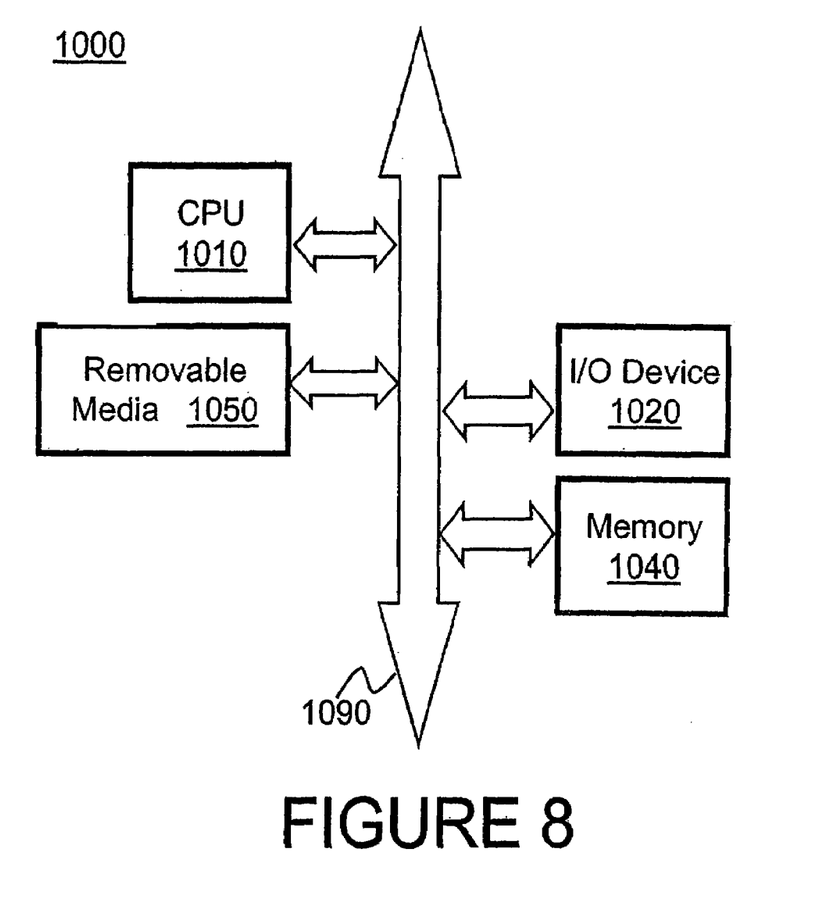
FIG. 8 is a processor system which includes a memory circuit such as a metal ion doped chalcogenide variable resistance memory device in accordance with an exemplary embodiment of the invention.

FIG. 8 illustrates a typical processor system 1000 which includes a memory circuit 1040 employing variable resistance memory cells such as chalcogenide memory cells in accordance with the invention. A processor system, such as a computer system, generally comprises a central processing unit (CPU) 1010, such as a microprocessor, a digital signal processor, or other programmable digital logic devices, which communicates with an input/output (I/O) device 1020 over a bus 1090. The memory circuit 1040 communicates with the CPU 1010 over bus 1090 typically through a memory controller.

In the case of a computer system, the processor system may include peripheral devices such as removable media devices 1050 which communicate with CPU 1010 over the bus 1090. Memory circuit 1040 is preferably constructed as an integrated circuit, which includes one or more resistance variable memory devices. If desired, the memory circuit 1040 may be combined with the processor, for example CPU 1010, in a single integrated circuit.

The above description and drawings should only be considered illustrative of exemplary embodiments that achieve the features and advantages of the invention. Modification and substitutions to specific process conditions and structures can be made without departing from the spirit and scope of the invention. Accordingly, the invention is not to be considered as being limited by the foregoing description and drawings, but is only limited by the scope of the appended claims.

What is claimed as new and desired to be protected by Letters Patent of the United States is:

1. A circuit for writing to a variable resistance memory cell, comprising:
   a variable resistance memory cell;
   a switchable current blocking device configured to block current from passing through the variable resistance memory cell when in an off state; and
   a charge storing element configured to charge while the switchable current blocking device is blocking current, and to discharge through the variable resistance memory cell when the switchable current blocking device is switched on and is not blocking current.

2. The circuit of claim 1, wherein the switchable current blocking device is a Zener diode.

3. The circuit of claim 2, wherein the charge storing element is capable of storing a voltage potential in excess of a Zener breakdown voltage of the Zener diode.

4. The circuit of claim 1, wherein the switchable current blocking device is a silicon-controlled rectifier.

5. The circuit of claim 4, wherein the silicon-controlled rectifier is controlled by a gating voltage that is applied so as to block current through the silicon-controlled rectifier during a first stage of a write cycle, and allow current through the silicon-controlled rectifier during a second stage of a write cycle.

6. The circuit of claim 1, wherein the switchable current blocking device and the variable resistance memory cell are in series.

7. The circuit of claim 1, wherein the charge storing element is parallel to the variable resistance memory cell and the switchable current blocking devoce.

8. The circuit of claim 1, wherein the charge storing element is a trace capable of storing charge sufficient to induce a write current through the variable resistance memory cell.

9. The circuit of claim 1, wherein the variable resistance memory cell is a phase change chalcogenide variable resistance memory cell.

10. The circuit of claim 1, wherein the variable resistance memory cell is an ionic chalcogenide variable resistance memory cell.

11. A variable resistance memory device comprising:
a variable resistance memory cell;
a switchable current blocking device in series with the variable resistance memory cell, the switchable current blocking device configured to block current from passing through the variable resistance memory cell when in an off state; and
a charge storing element in parallel with the variable resistance memory cell and the switchable current blocking device, the charge storing element configured to charge while the switchable current blocking device is blocking current, and to discharge through the variable resistance memory cell when the switchable current blocking device is switched to an on state and is not blocking current.

12. The memory device of claim 11, wherein the switchable current blocking device is a Zener diode.

13. The memory device of claim 12, wherein the charge storing element is capable of storing a voltage potential in excess of a Zener breakdown voltage of the Zener diode.

14. The memory device of claim 11, wherein the switchable current blocking device is a silicon-controlled rectifier.

15. The memory device of claim 14, wherein the silicon-controlled rectifier is controlled by a gating voltage that is applied so as to block current through the silicon-controlled rectifier during a first stage of a write cycle, and allow current through the silicon-controlled rectifier during a second stage of a write cycle.

16. The memory device of claim 11, wherein the charge storing element is a trace capable of storing charge sufficient to induce a write current through the variable resistance memory cell.

17. The memory device of claim 11, wherein the variable resistance memory cell is a phase change chalcogenide variable resistance memory cell.

18. The memory device of claim 11, wherein the variable resistance memory cell is an ionic chalcogenide variable resistance memory cell.

19. An array of variable resistance memory devices, comprising:
a plurality of memory devices, each comprising:
a variable resistance memory cell;
a switchable current blocking device configured to block current from passing through the variable resistance memory cell when in an off state; and
a charge storing element configured to charge while the switchable current blocking device is blocking current, and to discharge through the variable resistance memory cell when the switchable current blocking device switches to an on and is not blocking current.

20. The array of claim 19, wherein the switchable current blocking device is a Zener diode.

21. The array of claim 20, wherein the charge storing element is capable of storing a voltage potential in excess of a Zener breakdown voltage of the Zener diode.

22. The array of claim 19, wherein the switchable current blocking device is a silicon-controlled rectifier.

23. The array of claim 22, wherein the silicon-controlled rectifier is controlled by a gating voltage that is applied so as to block current through the silicon-controlled rectifier during a first stage of a write cycle, and allow current through the silicon-controlled rectifier during a second stage of a write cycle.

24. The array of claim 19, wherein the switchable current blocking device and the variable resistance memory cell are in series.

25. The array of claim 19, wherein the charge storing element is parallel to the variable resistance memory cell and the switchable current blocking device.

26. The array of claim 19, wherein the charge storing element is a trace capable of storing charge sufficient to induce a write current through the variable resistance memory cell.

27. The array of claim 19, wherein the variable resistance memory cell is a phase change chalcogenide variable resistance memory cell.

28. The array of claim 19, wherein the variable resistance memory cell is an ionic chalcogenide variable resistance memory cell.

29. A processing system, comprising:
a processor for receiving and processing data;
at least one memory array for exchanging data with the processor; and
a memory controller for managing memory access requests from the processor to the at least one memory array,
wherein each of the at least one memory array includes:
a plurality of memory devices, each comprising:
a variable resistance memory cell;
a switchable current blocking device in series with the variable resistance memory cell, the switchable current blocking device configured to block current from passing through the variable resistance memory cell when in an off state; and
a charge storing element in parallel with the variable resistance memory cell and the switchable current blocking device, the charge storing element configured to charge while the switchable current blocking device is blocking current, and to discharge through the variable resistance memory cell when the switchable current blocking device is switched on and is not blocking current.

30. The system of claim 29, wherein the switchable current blocking device is a Zener diode.

31. The system of claim 30, wherein the charge storing element is capable of storing a voltage potential in excess of a Zener breakdown voltage of the Zener diode.

32. The system of claim 29, wherein the switchable current blocking device is a silicon-controlled rectifier.

33. The system of claim 32, wherein the silicon-controlled rectifier is controlled by a gating voltage that is applied so as to block current through the silicon-controlled rectifier during a first stage of a write cycle, and allow current through the silicon-controlled rectifier during a second stage of a write cycle.

34. The system of claim 29, wherein the charge storing element is a trace capable of storing charge sufficient to induce a write current through the variable resistance memory cell.

35. The system of claim 29, wherein the variable resistance memory cell is a phase change chalcogenide variable resistance memory cell.

36. The system of claim 29, wherein the variable resistance memory cell is an ionic chalcogenide variable resistance memory cell.

37. A method for writing to a variable resistance memory cell comprising:
   blocking an initial write current through the variable resistance memory cell;
   charging a capacitive element during a time when the write current is blocked;
   discharging the capacitive element through the variable resistance memory cell at a time when the write current is not blocked through the variable resistance memory cell; and
   writing to the variable resistance memory cell via the current induced by discharging the capacitive element.

38. The method of claim 37, wherein blocking the initial write current is performed by using a Zener diode.

39. The method of claim 37, wherein discharging the capacitive element occurs because the initial write current is no longer blocked.

40. The method of claim 37, wherein blocking the initial write current is performed by using a silicon-controlled rectifier.

41. The method of claim 40, further comprising:
   applying a first gating voltage to the silicon-controlled rectifier to block current through the silicon-controlled rectifier during a first stage of a write cycle, and
   applying a second gating voltage to the silicon-controlled rectifier to allow current through the silicon-controlled rectifier during a second stage of a write cycle.

42. A method of fabricating a circuit for writing to a variable resistance memory cell, said method comprising the integrated circuit fabrication acts of:
   fabricating a variable resistance memory cell;
   fabricating a switchable current blocking device in series with the variable resistance memory cell, the switchable current blocking device configured to block current from passing through the variable resistance memory cell when in an off state; and
   fabricating a charge storing element in parallel with the variable resistance memory cell and the switchable current blocking device, the charge storing element configured to charge while the switchable current blocking device is blocking current, and to discharge through the variable resistance memory cell when the switchable current blocking device is switched on and is not blocking current.

43. The method of claim 42, wherein fabricating a switchable current blocking device includes fabricating a Zener diode.

44. The method of claim 42, wherein fabricating a switchable current blocking device includes fabricating a silicon-controlled rectifier.

45. The method of claim 42, wherein fabricating the charge storing element includes fabricating a trace capable of storing charge sufficient to induce a write current through the variable resistance memory cell.

46. The method of claim 42, wherein fabricating the variable resistance memory cell includes fabricating a phase change chalcogenide variable resistance memory cell.

47. The method of claim 42, wherein fabricating the variable resistance memory cell includes fabricating an ionic chalcogenide variable resistance memory cell.

* * * * *

UNITED STATES PATENT AND TRADEMARK OFFICE
CERTIFICATE OF CORRECTION

| | | |
|---|---|---|
| PATENT NO. | : 7,295,462 B2 | Page 1 of 1 |
| APPLICATION NO. | : 11/298614 | |
| DATED | : November 13, 2007 | |
| INVENTOR(S) | : Farnworth | |

It is certified that error appears in the above-identified patent and that said Letters Patent is hereby corrected as shown below:

In column 9, line 19, in Claim 7, delete "devoce" and insert -- device --, therefor.

Signed and Sealed this

First Day of April, 2008

JON W. DUDAS
*Director of the United States Patent and Trademark Office*